United States Patent
Wang et al.

(10) Patent No.: US 11,963,429 B2
(45) Date of Patent: Apr. 16, 2024

(54) DISPLAY MODULE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yu Wang, Beijing (CN); Yi Zhang, Beijing (CN); Tingliang Liu, Beijing (CN); Tinghua Shang, Beijing (CN); Huijuan Yang, Beijing (CN); Yang Zhou, Beijing (CN); Pengfei Yu, Beijing (CN); Linhong Han, Beijing (CN); Hao Zhang, Beijing (CN); Xiaofeng Jiang, Beijing (CN); Huijun Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/922,197

(22) PCT Filed: Jun. 19, 2020

(86) PCT No.: PCT/CN2020/097090
§ 371 (c)(1),
(2) Date: Oct. 28, 2022

(87) PCT Pub. No.: WO2021/253397
PCT Pub. Date: Dec. 23, 2021

(65) Prior Publication Data
US 2023/0180589 A1 Jun. 8, 2023

(51) Int. Cl.
*H10K 59/90* (2023.01)
*G06F 1/16* (2006.01)
(Continued)

(52) U.S. Cl.
CPC .......... *H10K 59/90* (2023.02); *G09G 3/3208* (2013.01); *H01L 24/32* (2013.01); *H10K 59/82* (2023.02);
(Continued)

(58) Field of Classification Search
USPC ..................................................... 345/212
See application file for complete search history.

(56) References Cited

U.S. PATENT DOCUMENTS

| 11,611,333 B1* | 3/2023 | Jiang | G06F 3/0418 |
| 2007/0126667 A1* | 6/2007 | Nakamura | G09G 3/325 345/76 |

(Continued)

FOREIGN PATENT DOCUMENTS

| CN | 103474019 A | 12/2013 |
| CN | 103929062 A | 7/2014 |

(Continued)

*Primary Examiner* — Chineyere D Wills-Burns
(74) *Attorney, Agent, or Firm* — Nath, Goldberg & Meyer; Joshua B. Goldberg (57) ABSTRACT

A display module (10) includes: a display panel (12) and a circuit board (14) coupled to the display panel (12). The display panel (12) includes a driving chip (122) and a display unit (124); and the circuit board (14) includes a first filter element (142), wherein the first filter element (142) is coupled to the driving chip (122) and the display unit (124), and a direct current signal output by the driving chip (122) is filtered by the first filter element (142) and then transmitted to the display unit (124). The present disclosure also provides a display apparatus (100).

16 Claims, 4 Drawing Sheets

(51) Int. Cl.
  *G06F 1/26* (2006.01)
  *G09G 3/3208* (2016.01)
  *H01L 23/00* (2006.01)
  *H10K 59/00* (2023.01)
  *H10K 59/82* (2023.01)

(52) U.S. Cl.
  CPC ............... *G09G 2320/0204* (2013.01); *G09G 2330/021* (2013.01); *H01L 24/13* (2013.01); *H01L 2224/13023* (2013.01); *H01L 2224/32145* (2013.01)

(56) References Cited

U.S. PATENT DOCUMENTS

| | | | | |
|---|---|---|---|---|
| 2008/0180075 A1* | 7/2008 | Xie | ........................ | H02M 3/156 323/282 |
| 2011/0193830 A1* | 8/2011 | Cho | ..................... | G09G 3/3648 345/204 |
| 2014/0184959 A1* | 7/2014 | Zhang | .................... | H05B 45/10 315/193 |
| 2014/0292227 A1* | 10/2014 | Hu | ......................... | H05B 45/44 315/307 |
| 2015/0062106 A1* | 3/2015 | Hwang | ................ | G09G 3/3688 345/212 |
| 2019/0362665 A1* | 11/2019 | Chang | .................... | H01L 23/60 |
| 2020/0045820 A1* | 2/2020 | Jin | ......................... | H05K 1/147 |
| 2020/0168173 A1* | 5/2020 | Adachi | ................ | G09G 3/3677 |
| 2020/0319743 A1* | 10/2020 | Yoo | ..................... | H10K 59/126 |

FOREIGN PATENT DOCUMENTS

| | | |
|---|---|---|
| CN | 104036727 A | 9/2014 |
| CN | 105206248 A | 12/2015 |
| CN | 105590613 A | 5/2016 |
| CN | 107885363 A | 4/2018 |
| JP | 2017142359 A | 8/2017 |

* cited by examiner

DISPLAY MODULE AND DISPLAY APPARATUS

This is a National Phase Application filed under 35 U.S.C. 371 as a national stage of PCT/CN2020/097090, filed Jun. 19, 2020, the content of each of which is hereby incorporated by reference in its entirety.

TECHNICAL FIELD

The present disclosure relates to the field of display technology, in particular to a display module and a display apparatus.

BACKGROUND

In the related art, with the development of the organic light-emitting diode (OLED) technology, chip on panel (COP) technology has been widely applied to the design for a display panel of an OLED due to its advantages of low cost and high integration. In the design of the chip on panel, a direct current (DC) signal required in the display panel may be output by a driving chip into the display panel. However, when an electronic device outputs a signal, a disturbance may be generated in the signal. Such the disturbance is generally a high-frequency disturbance, which can cause a jump of a transient voltage of the signal, and further influences display performance of a screen.

SUMMARY

The present disclosure provides a display module and a display apparatus.

A display module provided by the embodiment of the present disclosure includes a display panel including a driving chip and a display unit; and a circuit board coupled to the display panel and including a first filter element, wherein the first filter element is coupled to the driving chip and the display unit, and a current signal output by the driving chip is filtered by the first filter element and then transmitted to the display unit.

In some embodiments, the display panel includes a flexible connection portion on which the display panel is bonded to the circuit board; and the circuit board is coupled to the flexible connection portion.

In some embodiments, the flexible connection portion includes: a direct current output pin coupled to the driving chip and the first filter element; and a direct current input pin coupled to the first filter element and the display unit.

In some embodiments, the direct current input pin and the direct current output pin are spaced apart from each other.

In some embodiments, the direct current output pin includes a plurality of direct current output pins on two opposite sides of the flexible connection portion, respectively.

In some embodiments, the display panel includes a chip connection portion, and the driving chip is coupled to the chip connection portion through an anisotropic conductive film.

In some embodiments, the chip connection portion includes a chip input terminal coupled to the flexible connection portion.

In some embodiments, the chip input terminal is coupled to the direct current output pin.

In some embodiments, the chip connection portion includes a chip output terminal coupled to the direct current output pin and the display unit.

In some embodiments, the first filter element includes a low-pass filter circuit.

In some embodiments, the first filter element includes a load resistor and a filter capacitor coupled in parallel with the load resistor; and the first filter element is coupled in series between the driving chip and the display unit.

In some embodiments, the direct current signal includes a plurality of direct current signals; and the first filter elements includes a plurality of first filter elements in one-to-one correspondence with the plurality of direct current signals.

In some embodiments, the display unit includes display pixels, and the direct current signal includes a high-level voltage signal; and the high-level voltage signal is transmitted to the display unit to drive the display pixels to operate.

In some embodiments, the display unit includes display pixels, and the direct current signal includes a low-level voltage signal; and the low-level voltage signal is transmitted to the display unit to drive the display pixels to operate.

In some embodiments, the display unit includes display pixels, and the direct current signal includes a reset voltage signal; and the reset voltage signal is transmitted to the display unit to drive the display pixels to be reset.

In some embodiments, the driving chip includes a second filter element in the driving chip and configured to output the direct current signal.

In some embodiments, the circuit board includes a flexible circuit board and/or a printed circuit board.

A display apparatus provided by the embodiment of the present disclosure includes the display module of any one of the above embodiments.

In the display module and the display apparatus of the embodiment of the present disclosure, the display module is provided with the first filter element on the circuit board, so that the direct current signal output by the driving chip is filtered, and the disturbance of the direct current signal output to the display unit in the display panel is reduced.

Additional aspects and advantages of embodiments of the present disclosure will be set forth in part in the description which follows and, in part, will be obvious from the description, or may be learned by practice of embodiments of the present application.

BRIEF DESCRIPTION OF DRAWINGS

The above and/or additional aspects and advantages of the present disclosure will become apparent and readily appreciated from the following description of the embodiments in conjunction with the accompanying drawings, in which.

Description of main elements in the drawings: Display module 10; Display panel 12; Driving chip 122; Second filter element 1222; Display unit 124; Flexible connection portion 126; Direct current output pin 1262; Direct current input pin 1264; Chip connection portion 128; Chip input terminal 1282; Chip output terminal 1284; Circuit board 14; First filter element 142; and Display apparatus 100.

DETAIL DESCRIPTION OF EMBODIMENTS

Embodiments of the present disclosure will be described below in detail, and examples of the embodiments are illustrated in the accompanying drawings, wherein like or similar reference numerals refer to the same or similar elements or elements having the same or similar functions throughout the description. The embodiments described below with reference to the accompanying drawings are exemplary only for explaining the present disclosure and are not to be construed as limiting the present disclosure.

The present disclosure provides many different embodiments or examples for implementing different structures of the present disclosure. To simplify the disclosure of the present disclosure, components and their arrangements in specific examples are described below. Obviously, they are merely examples and are not intended to limit the present disclosure. Further, reference numerals and/or reference letters may be repeated in the various examples of the present disclosure for simplicity and clarity, which does not itself indicate a relationship between the various embodiments and/or their arrangements discussed. In addition, the present disclosure provides examples of various specific processes and materials, but one of ordinary skill in the art may recognize the application of other processes and/or the use of other materials.

Figure 1:
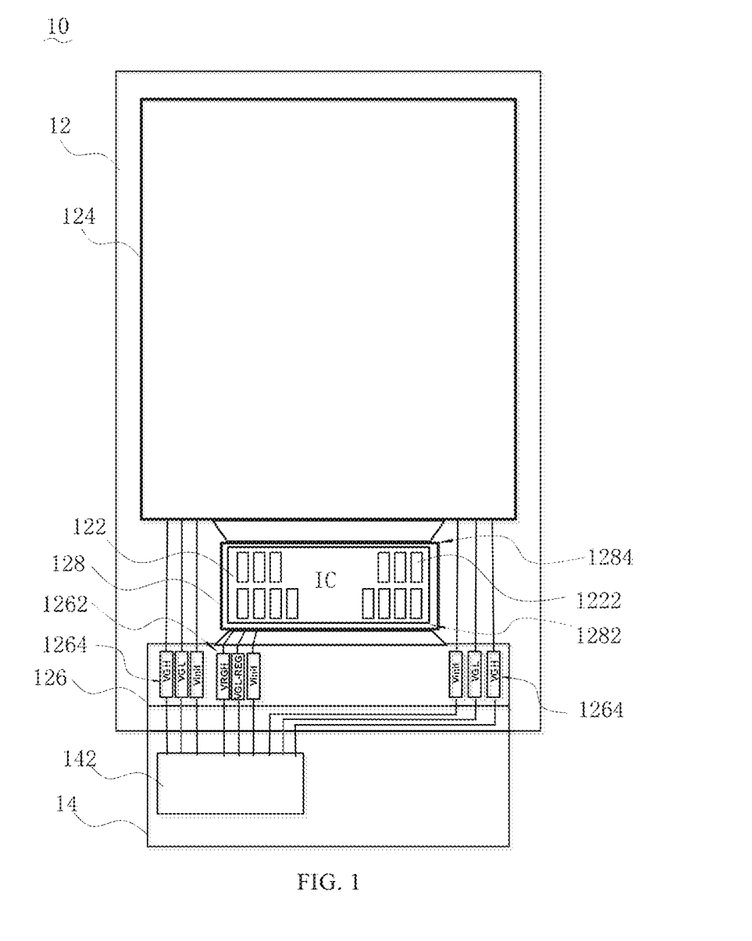
FIG. 1 is a schematic structural diagram of a display module according to an embodiment of the present disclosure.
Figure 2:
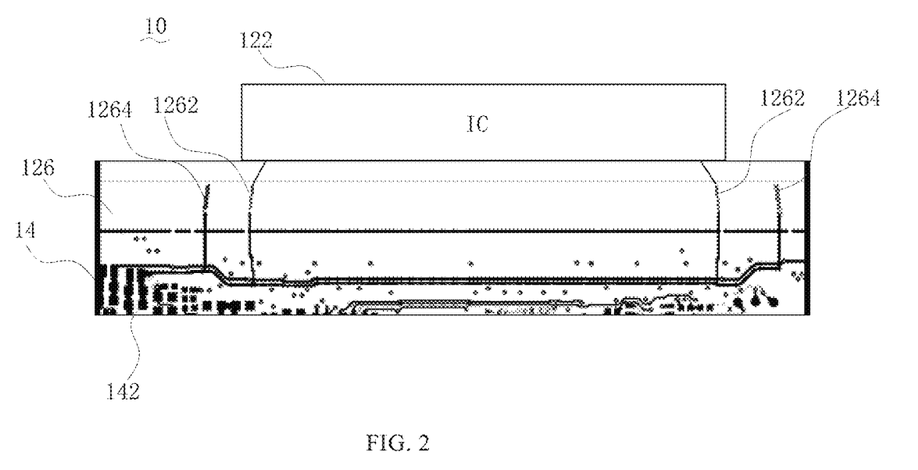
FIG. 2 is a schematic diagram of a connection in a display module according to an embodiment of the present disclosure.

Referring to FIG. 1 and FIG. 2, a display module 10 according to an embodiment of the present disclosure includes a display panel 12 and a circuit board 14 coupled to the display panel 12. The display panel 12 includes a driving chip 122 and a display unit 124. The circuit board 14 includes a first filter element 142 coupled to the driving chip 122 and the display unit 124, and a direct current signal output by the driving chip 122 is filtered by the first filter element 142 and then transmitted to the display unit 124.

In the display module 10 according to the embodiment of the present disclosure, the driving chip 122 is bonded directly on the display panel 12, and outputs an electrical signal to drive the display unit 124 to display, the display module 10 includes the circuit board 14, the first filter element 142 is disposed on the circuit board 14 and coupled to a direct current signal output terminal of the driving chip 122, so as to filter the direct current signal output by the driving chip 122, and then output the filtered direct current signal to the display unit 124 in the display panel 12, thereby reducing the disturbance in the direct current signal output to the display unit 124 and ensuring the normal display of the display unit 124.

In some embodiments, the display panel 12 may be an organic light-emitting diode (OLED) display panel.

Organic light-emitting diodes are used for displaying in the organic light-emitting diode display panel, which can realize an autonomous light emission, a customized drive on pixel points, and a display function without a backlight, so that the organic light-emitting diode display panel has the advantages of lightness, thinness, low energy consumption, high brightness, good luminous efficiency and the like.

Further, the organic light-emitting diode display panel may employ a flexible substrate on which driving circuits and display pixels are integrated, so that a flexible display panel, an irregular display panel, or the like may be manufactured. In addition, the organic light-emitting diode display panel may also be formed as a transparent display panel with good light transmission, thereby meeting more display requirements.

In some embodiments, the driving chip 122 may be coupled to the display unit 124 through internal wires of the display panel 12, and provide a driving signal for driving the display unit 124 to operate.

Specifically, the driving chip 122 may further output a square wave signal, such as, a gate driver on array (GOA) signal and/or a multiplexer (MUX) signal, where the gate driver on array signal may be used to implement a row-by-row scanning of row gating signals, and the multiplexer signal may be used to select data in any one of a plurality of paths as required during a data transmission through the plurality of paths to display corresponding pixels. Thus, the square wave signal may be output directly from the driving chip 122 and transmitted to the display unit 124 through the internal wires of the panel, thereby controlling the display unit 124 to display.

In some embodiments, the driving chip 122 may be an integrated circuit (IC) chip.

In some embodiments, the display panel 12 includes a flexible connection portion 126, the display panel 12 is bonded to the circuit board 14 in the flexible connection portion 126, and the flexible connection portion 126 is coupled to the driving chip 122 and the circuit board 14.

In this way, the circuit board 14 may be bonded to the flexible connection portion 126 through bonding pins, so that the circuit board 14 is electrically coupled to the driving chip 122. In addition, a portion of the internal wires of the display panel 12 bypassing the driving chip 122 (for example, ELVDD wires and ELVSS wires through which power is provided for the display unit 124) may also be led out from the flexible connection portion 126 and be electrically coupled to the circuit board 14.

In some embodiments, the flexible connection portion 126 is provided with direct current output pins 1262 coupled to the driving chip 122 and the first filter element 142 and direct current input pins 1264 coupled to the first filter element 142 and the display unit 124.

In this way, the direct current signal of the driving chip 122 may be output to the direct current output pin 1262 and then is transmitted to the circuit board 14 bonded to the flexible connection portion 126, and then is filtered by the first filter element 142 on the circuit board 14 and then transmitted to the direct current input pin 1264 of the flexible connection portion 126 again, finally to the display unit 124.

In some embodiments, the direct current input pins 1264 are spaced apart from the current output pins 1262. Therefore, a mutual influence between the direct current signal output from the direct current output pin 1262 to the circuit board 14 by the driving chip 12 and the direct current signal filtered by the first filter element 142 can be reduced, and the normal operation of the display panel 12 can be ensured.

In some embodiments, the flexible connection portion 126 is provided with a plurality of direct current input pins 1264 disposed at two opposite sides of the flexible connection portion 126, respectively.

Specifically, the flexible connection portion 126 may be disposed along one side of the display panel 12, that is, pins, which are coupled between an external circuit and the internal wires of the display panel 12 may be led out from one side of the display panel 12. The plurality of direct current input pins 1264 are located on two opposite sides of the flexible connection portion 126, such that the direct current signal filtered by the first filter element 142 may be transmitted to two sides of the display panel 12 adjacent to the side where the flexible connection portion 126 is located, respectively, and thus, the direct current signal may be transmitted to two opposite sides of the display panel 12 nearby and may simultaneously drive the display unit 124 from two opposite sides of the display panel 12, thereby optimizing a design for the internal wires of the display panel 12.

In one example, only one direct current signal may be included, for example, a reset voltage signal Vinit; the plurality of the direct current input pins 1264 may include two direct current input pins 1264 respectively disposed at two opposite sides of the flexible connection portion 126. The reset voltage signal Vinit filtered by the at least one first filter element 142 may be input to the display unit 124 through the two direct current input pins 1264.

In another example, a plurality of the direct current signals may be included, and two direct current input pins 1264 may be correspondingly provided for each direct current signal, and are respectively provided at two opposite sides of the flexible connection portion 126.

In some embodiments, only one direct current output pin 1262 may be provided, and a direct current signal output from the direct current output pin 1262 is filtered by the first filter element 142 and then divided into signals in two paths, which are in turn respectively transmitted to the direct current input pins 1264 on both sides of the flexible connection portion 126.

In other embodiments, two direct current output pins 1262 may be provided (as shown in FIG. 2), and direct current signals output from the two direct current output pins 1262 are filtered by the first filter element 142 and then respectively transmitted to the direct current input pins 1264 on both sides of the flexible connection portion 126. Preferably, the two direct current output pins 1262 may be disposed on two opposite sides of the flexible connection portion 126.

Obviously, in other embodiments, the number and the position of the direct current input pins 1264 and the number and the position of the direct current output pin 1262 may not be limited to the above embodiments, and may be set appropriately as needed, and are not limited in detail herein.

Figure 3:
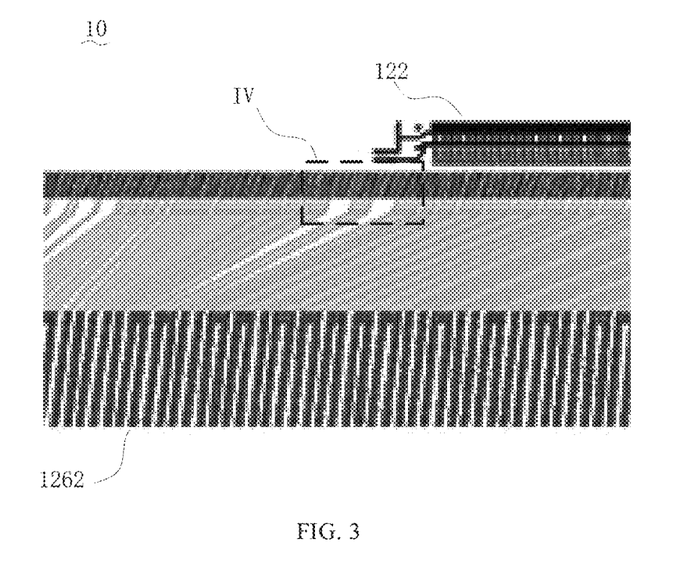
FIG. 3 is a schematic diagram of a connection of a driving chip of a display module according to an embodiment of the present disclosure.
Figure 4:
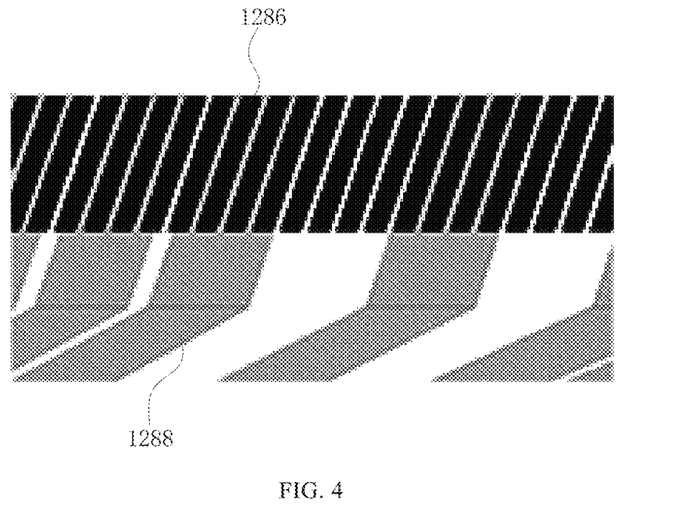
FIG. 4 is an enlarged schematic diagram of the display module in an area IV in FIG. 3.

Referring to FIGS. 1, 3 and 4, in some embodiments, the display panel 12 includes a chip connection portion 128, and the driving chip 122 is coupled to the chip connection portion 128 through an anisotropic conductive film (ACF).

The anisotropic conductive film is a conductive film that is insulated in a transverse direction and electrically conducted in a longitudinal direction. The chip connection portion 128 is coupled by using the anisotropic conductive film through a bonding process, so that the driving chip 122 may be electrically coupled to circuits in the display panel 12 in the longitudinal direction. Compared with a case where the driving chip 122 is bonded to the flexible circuit board 14 by using a chip on film (COF) bonding method, the present scheme of the chip on panel has a lower cost and a higher integration.

In some embodiments, the chip connection portion 128 includes a chip input terminal 1282 coupled to the flexible connection portion 126.

In this way, the display panel 12 is bonded to the circuit board 14 on the flexible connection portion 126, so that the circuit board 14 may transmit data signals, control signals, power signals or the like to the driving chip 122 through the flexible connection portion 126 and the chip input terminal 1282.

In some embodiments, the chip input terminal 1282 is coupled to the direct current output pin 1262.

The chip input terminal 1282 is coupled to the flexible connection portion 126, and the direct current signal output by the driving chip 122 is transmitted to the circuit board 14 through the direct current output pin 1262 of the flexible connection portion 126, so that the direct current signal may be output from the chip input terminal 1282 by the chip input terminal 1282 coupled to the direct current output pin 1262. At this case, the flexible connection portion 126 and the chip input terminal 1282 may be close to each other, that is, the chip input terminal 1282 is disposed close to the flexible connection portion 126, so that a wire connection between the chip input terminal 1282 and the flexible connection portion 126 is shortened, which is beneficial to a design for wires of the direct current signal transmission.

In other embodiments, the chip connection portion 128 includes a chip output terminal 1284 coupled to the direct current output pin 1262 and the display unit 124.

It is understood that the driving chip 122 may transmit data signals, control signals, etc. to the display unit 124 through the chip output terminal 1284 to drive the display unit 124 to display. In addition, the direct current signal may not be output from the chip input terminal 1282, but may be output from the chip output terminal 1284 as an output signal of the driving chip 122, and then output to the direct current output pin 1262 of the flexible connection portion 126 through the internal wires of the display panel 12.

As shown in FIG. 4, in some embodiments, both the chip input terminal 1282 and the chip output terminal 1284 are provided with a plurality of bumps 1286, so that both the chip input terminal 1282 and the chip output terminal 1284 are electrically coupled to the driving chip 122. Each connection line 1288 inside the display panel 12 coupled to the driving chip 122 is coupled to the plurality of bumps 1286.

In some embodiments, the first filter element 142 includes a low-pass filter circuit.

Therefore, the low-pass filter circuit filters out the high-frequency disturbance in the direct current signal, so that the jump of the transient voltage of the direct current signal can be reduced or avoided, and the display performance of the display module 10 is ensured.

Figure 5:
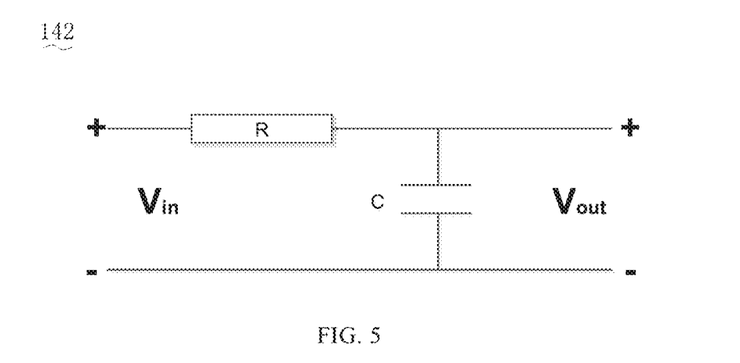
FIG. 5 is a circuit diagram of a first filter element according to an embodiment of the present disclosure.

Referring to FIG. 5, in some embodiments, the first filter element 142 includes a load resistor R and a filter capacitor C coupled in parallel with the load resistor R. The first filter element 142 is coupled in series between the driving chip 122 and the display unit 124.

In this way, the filter capacitor C may be a grounded capacitor, i.e., one terminal of the filter capacitor C is coupled in parallel with the load resistor R, and the other terminal of the filter capacitor C is grounded. Because a capacitor has the characteristics of passing an alternating current and blocking a direct current, the capacitor is coupled in parallel in a circuit, so that a direct current part in a direct current signal output by the driving chip 122 may be transmitted to the display unit 124 through the load resistor R, and the high-frequency disturbance in the direct current signal output by the driving chip 122 may be filtered out through the grounded filter capacitor C, thereby ensuring the stability of the direct current signal.

Figure 6:
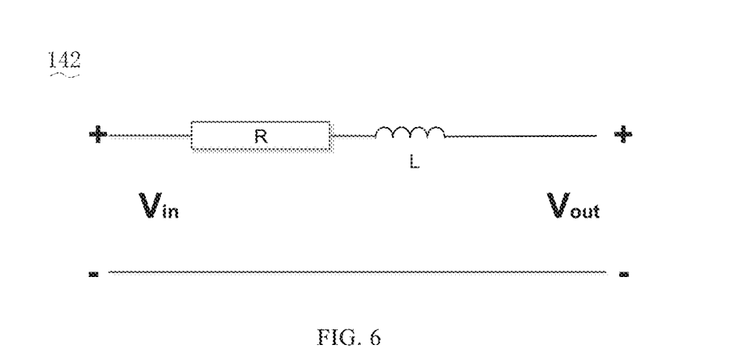
FIG. 6 is another circuit diagram of a first filter element according to the embodiment of the present disclosure.

Referring to FIG. 6, in some embodiments, the first filter element 142 includes a load resistor R and an inductor L coupled in series with the driving chip 122 and the display unit 124.

Therefore, because the inductor has the characteristics of passing a direct current and blocking an alternating current, the inductor L is coupled in series in a circuit, so that the voltage jump generated by the high-frequency disturbance in the direct current signal can be weakened, thereby ensuring the stability of the direct current signal.

Obviously, in other embodiments, the first filter element 142 may also be a complex filter circuit formed by combining a capacitor and an inductor, and may be designed according to actual filter requirements, which is not specifically limited herein.

In some embodiments, the direct current signal includes a plurality of direct current signals, and a plurality of first filter elements 142 are provided in one-to-one correspondence with the plurality of direct current signals.

Therefore, different filter elements may be adopted for filter different direct current signals, each direct current signal may be independently kept stable, thereby ensuring the normal display of the display module 10.

In some embodiments, the direct current signal includes a plurality of direct current signals, and the first filter element 142 includes a plurality of low-pass filter circuits, each of which may filter the plurality of direct current signals, respectively.

Specifically, the plurality of direct current signals are transmitted from different direct current output pins 1262 to the first filter element 142, and are filtered by different filter circuits and transmitted to the display unit 124 through different direct current input pins 1264.

Under the condition that each direct current signal is transmitted through the plurality of direct current output pins 1262, the direct current signal from each direct current output pin 1262 may be filtered by an individual filter circuit, so as to ensure that the direct current signals output by the driving chip 122 are stably transmitted, and to ensure the normal operation of the display module 10.

In some embodiments, the display unit 124 includes display pixels (not shown), the direct current signal includes a high-level voltage signal VGH for implementing a gate driving and having a shift register function, and the high-level voltage signal VGH is transmitted to the display unit 124 to drive the display pixels to operate.

Specifically, the circuit board 14 may provide a power signal to the driving chip 122 to supply power to the chip, and the driving chip 122 may generate a chip high-level voltage signal VRGH required inside the driving chip 122 according to the power signal. At this case, the chip high-level voltage signal VRGH may serve as the direct current signal output by the driving chip 122. Further, the chip high-level voltage signal VRGH is filtered by the first filter element 142 and then may be stably output as the high-level voltage signal VGH required by the display unit 124.

In some embodiments, the display unit 124 includes display pixels, the direct current signal includes a low-level voltage signal VGL for implementing a gate driving and having a shift register function, and the low-level voltage signal VGL is transmitted to the display unit 124 to drive the display pixels to operate.

Accordingly, the driving chip 122 may generate a chip low-level voltage signal VGL-REG required inside the driving chip 122 according to the power signal. At this case, the chip low-level voltage signal VGL-REG may be the direct current signal output by the driving chip 122. Further, the chip low-level voltage signal VGL-REG may be filtered by the first filter element 142 and then may be stably output as the low-level voltage signal VGL required by the display unit 124.

It should be noted that the high-level voltage signal VGH and the low-level voltage signal VGL may be used to turn on or off the display pixels, respectively. In one example, the high-level voltage signal VGH transmitted to the display unit 124 may be used to drive the display pixels to be turned on, and the low-level voltage signal VGL transmitted to the display unit 124 may be used to drive the display pixels to be turned off. In another example, the high-level voltage signal VGH transmitted to the display unit 124 may be used to drive the display pixels to be turned off, and the low-level voltage signal VGL transmitted to the display unit 124 may be used to drive the display pixels to be turned on.

In some embodiments, the display unit 124 includes display pixels, the direct current signal includes a reset voltage signal Vinit transmitted to the display unit 124 to drive the display pixels to be reset.

In this way, the display pixels may be reset after each frame of display image is refreshed, and the reset voltage signal Vinit drives the display pixels to be reset, so that the display pixels are in an initial state when starting to display the next frame of image so as to accurately control a display state of the display pixels.

In some embodiments, the display pixels may be arranged in an array, and may include red, green, and blue sub-pixels. The red sub-pixel may emit red light, the green sub-pixel may emit green light, and the blue sub-pixel may emit blue light. Light emitted by the corresponding display pixels may be mixed to form visible light of different colors by controlling the brightness of the red sub-pixel, the brightness of the green sub-pixel and the brightness of the blue sub-pixel, and then the display module 10 may display corresponding colors.

In some embodiments, the driving chip 122 includes a second filter element 1222 disposed within the driving chip 122 and configured to output a direct current signal.

In this way, as shown in FIG. 1, the driving chip 122 itself is provided with the second filter element 1222, the driving chip 122 may output the filtered direct current signal. The driving chip 122 may output the direct current signal filtered by the second filter element 1222, and then, the direct current signal is filtered by the first filter element 142 again, so that the direct current signal output to the display unit 124 is more stable.

In some embodiments, the circuit board 14 includes a flexible printed circuit (FPC) and/or a printed circuit board (PCB).

In some embodiments, the circuit board 14 includes a flexible circuit board, which may be embedded in a circuit, and an electronic component may be disposed in a narrow and limited space to form the first filter element 142 so as to filter the direct current signal output by the driving chip 122. Meanwhile, the flexible circuit board is bendable, which facilitates the assembly of the display module 10, so that the display module 10 is coupled to an external circuit.

In other embodiments, the circuit board 14 includes a printed circuit board, which may integrate electronic devices therein, so that a complex circuit layout is realized, which is beneficial for the design of the first filter element 142. Further, the printed circuit board generally has a relatively high hardness, and may be coupled to the display panel 12 through the flexible circuit board, so that the printed circuit board is prevented from being directly coupled to the display panel 12 and thus the display panel 12 is prevented from being damaged. At this case, the first filter element 142 is disposed on the printed circuit board, and the flexible circuit board may be only provided with the connection wires without electronic components therein.

In still other embodiments, the circuit board 14 includes a flexible circuit board and a printed circuit board, and the first filter element 142 is disposed on the flexible circuit board and the printed circuit board. For example, some electronic components of the first filter element 142 are disposed on the flexible circuit board, and other electronic components are disposed on the printed circuit board. Alternatively, with the plurality of first filter elements 142, some first filter elements 142 are disposed on the flexible circuit board, and other first filter elements 142 are disposed on the printed circuit board.

Figure 7:
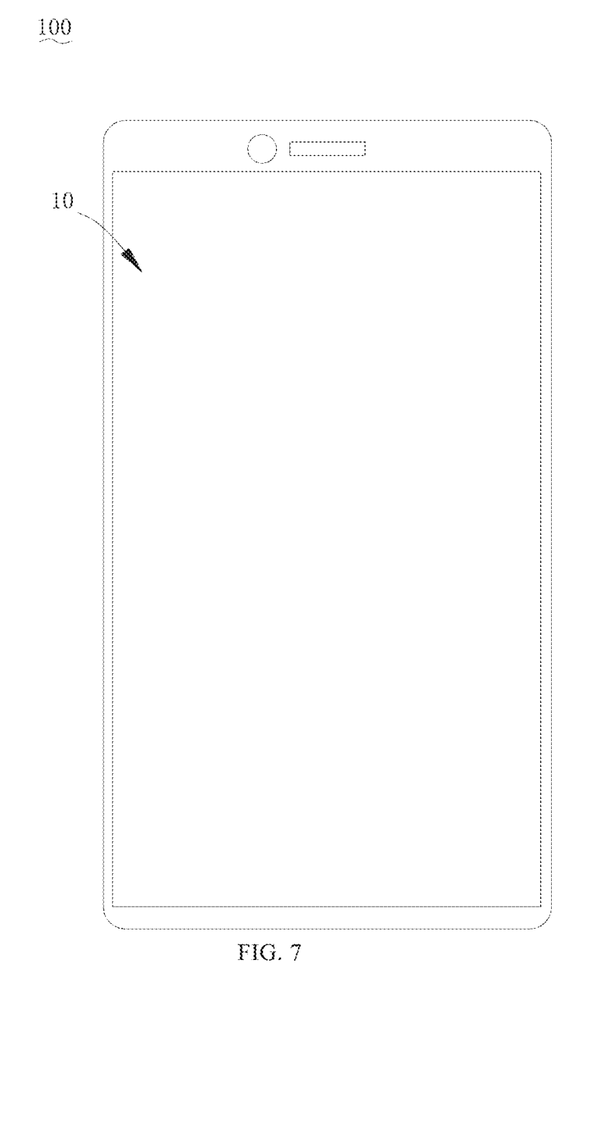
FIG. 7 is a schematic structural diagram of a display apparatus according to an embodiment of the present disclosure.

Referring to FIG. 7, a display apparatus 100 according to an embodiment of the present disclosure includes the display module 10 according to any one of the embodiments.

In the display apparatus 100 according to the embodiment of the present disclosure, in the display module 10, the driving chip 122 is bonded directly on the display panel 12, and outputs an electrical signal to drive the display unit 124 to display; the display module 10 includes the circuit board 14, the first filter element 142 is disposed on the circuit board 14 and coupled to a direct current signal output terminal of the driving chip 122, so as to filter the direct current signal output by the driving chip 122, and then the filtered direct current signal is output to the display unit 124 in the display panel 12, thereby reducing the disturbance in the direct current signal output to the display unit 124 and ensuring the normal display of the display unit 124.

In some embodiments, the display apparatus 100 may be an electronic apparatus with a display function, such as a mobile phone, a tablet computer, a notebook computer, a smart band, a smart watch, or other wearable apparatus. In the embodiment shown in FIG. 7, the display apparatus 100 is a mobile phone.

In the description of the present specification, reference to the description of "certain embodiments", "one embodiment", "some embodiments", "illustrative embodiments", "examples", "specific examples", or "some examples" or the like means that a particular feature, structure, material, or characteristic described in connection with the embodiment or example is included in at least one embodiment or example of the present disclosure. In this specification, schematic expression of the above terms do not necessarily refer to the same embodiment or example. Furthermore, the particular features, structures, materials, or characteristics described may be combined in any suitable manner in any one or more embodiments or examples.

Although embodiments of the present disclosure have been shown and described above, it is understood that the above embodiments are exemplary and should not be construed as limiting the present disclosure; and that variations, modifications, substitutions and alterations in the above embodiments may be made by one of ordinary skill in the art within the scope of the present disclosure.

What is claimed is:

1. A display module, comprising:
    a display panel comprising a driving chip and a display unit; and
    a circuit board coupled to the display panel and comprising a first filter element,
    wherein the first filter element is coupled to the driving chip and the display unit, and a direct current signal output by the driving chip is filtered by the first filter element and then transmitted to the display unit,
    the display panel comprises a flexible connection portion on which the display panel is bonded to the circuit board;
    the flexible connection portion is coupled to the driving chip and the circuit board, and
    wherein the flexible connection portion comprises:
    a direct current output pin coupled to the driving chip and the first filter element; and
    a direct current input pin coupled to the first filter element and the display unit.

2. The display module of claim 1, wherein the direct current input pin and the direct current output pin are spaced apart from each other.

3. The display module of claim 1, wherein the direct current output pin comprises a plurality of direct current output pins on two opposite sides of the flexible connection portion, respectively.

4. The display module of claim 1, wherein
    the display panel comprises a chip connection portion, and
    the driving chip is coupled to the chip connection portion through an anisotropic conductive film.

5. The display module of claim 4, wherein the chip connection portion comprises a chip input terminal coupled to the flexible connection portion.

6. The display module of claim 5, wherein the chip input terminal is coupled to the direct current output pin.

7. The display module of claim 4, wherein the chip connection portion comprises a chip output terminal coupled to the direct current output pin and the display unit.

8. The display module of claim 1, wherein the first filter element comprises a low-pass filter circuit.

9. The display module of claim 8, wherein
    the first filter element comprises a load resistor and a filter capacitor coupled in parallel with the load resistor; and
    the first filter element is coupled in series between the driving chip and the display unit.

10. The display module of claim 1, wherein
    the direct current signal comprises a plurality of direct current signals; and
    the first filter element comprises a plurality of first filter elements in one-to-one correspondence with the plurality of direct current signals.

11. The display module of claim 1, wherein
    the display unit comprises display pixels, and the direct current signal comprises a high-level voltage signal; and
    the high-level voltage signal is transmitted to the display unit to drive the display pixels to operate.

12. The display module of claim 1, wherein
    the display unit comprises display pixels, and the direct current signal comprises a low-level voltage signal; and
    the low-level voltage signal is transmitted to the display unit to drive the display pixels to operate.

13. The display module of claim 1, wherein
    the display unit comprises display pixels, and the direct current signal comprises a reset voltage signal; and
    the reset voltage signal is transmitted to the display unit to drive the display pixels to be reset.

14. The display module of claim 1, wherein the driving chip comprises a second filter element therein and configured to output the direct current signal.

15. The display module of claim 1, wherein the circuit board comprises at least one of a flexible circuit board and a printed circuit board.

16. A display apparatus, comprising a display module, wherein the display module comprises:
    a display panel comprising a driving chip and a display unit; and
    a circuit board coupled to the display panel and comprising a first filter element,
    wherein the first filter element is coupled to the driving chip and the display unit, and a direct current signal output by the driving chip is filtered by the first filter element and then transmitted to the display unit,
the display panel comprises a flexible connection portion on which the display panel is bonded to the circuit board;
the flexible connection portion is coupled to the driving chip and the circuit board, and
wherein the flexible connection portion comprises:
a direct current output pin coupled to the driving chip and the first filter element; and
a direct current input pin coupled to the first filter element and the display unit.

* * * * *